US008318556B2

(12) United States Patent
Wang et al.

(10) Patent No.: US 8,318,556 B2
(45) Date of Patent: Nov. 27, 2012

(54) METHOD AND SYSTEM FOR CONTINUOUS LINE-TYPE LANDING POLYSILICON CONTACT (LPC) STRUCTURES

(75) Inventors: Ping Ting Wang, Shanghai (CN); Cheng Yang, Shanghai (CN); Seung Hyuk Lee, Shanghai (CN); Jin Gang Wu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 201 days.

(21) Appl. No.: 12/704,511

(22) Filed: Feb. 11, 2010

(65) Prior Publication Data
US 2011/0042732 A1    Feb. 24, 2011

(30) Foreign Application Priority Data
Aug. 20, 2009   (CN) .......................... 2009 1 0056718

(51) Int. Cl.
*H01L 29/72* (2006.01)
(52) U.S. Cl. ........ 438/197; 438/657; 438/669; 438/675; 438/684; 438/692
(58) Field of Classification Search .................. 438/197, 438/657, 669, 675, 684, 692
See application file for complete search history.

(56) References Cited

U.S. PATENT DOCUMENTS

| 5,258,096 | A | 11/1993 | Sandhu et al. |
| 6,977,197 | B2 | 12/2005 | Park et al. |
| 2009/0085213 | A1* | 4/2009 | Higashi et al. ................ 257/754 |

* cited by examiner

*Primary Examiner* — Edward Wojciechowicz
(74) *Attorney, Agent, or Firm* — Kilpatrick Townsend & Stockton LLP

(57) ABSTRACT

A method for making contact landing pad structures in a semiconductor integrated circuit device includes forming an isolation region and forming active regions in the semiconductor substrate. The active regions are separated by the isolation region, and each of the active regions includes one or more contact regions. The method includes forming a raised structure overlying the isolation region and disposed between a first and second contact regions. The method includes depositing a cap layer and forming an interlayer dielectric layer overlying the cap layer. The method includes depositing a photoresist layer overlying the interlayer dielectric layer and uses a mask pattern to selectively remove a portion of the photoresist layer to form a line type opening, which exposes a portion of the interlayer dielectric layer overlying at least the first and second contact regions. The method deposits a conductive fill material and performs a planarization process to form multiple conductive landing contact pads.

20 Claims, 13 Drawing Sheets

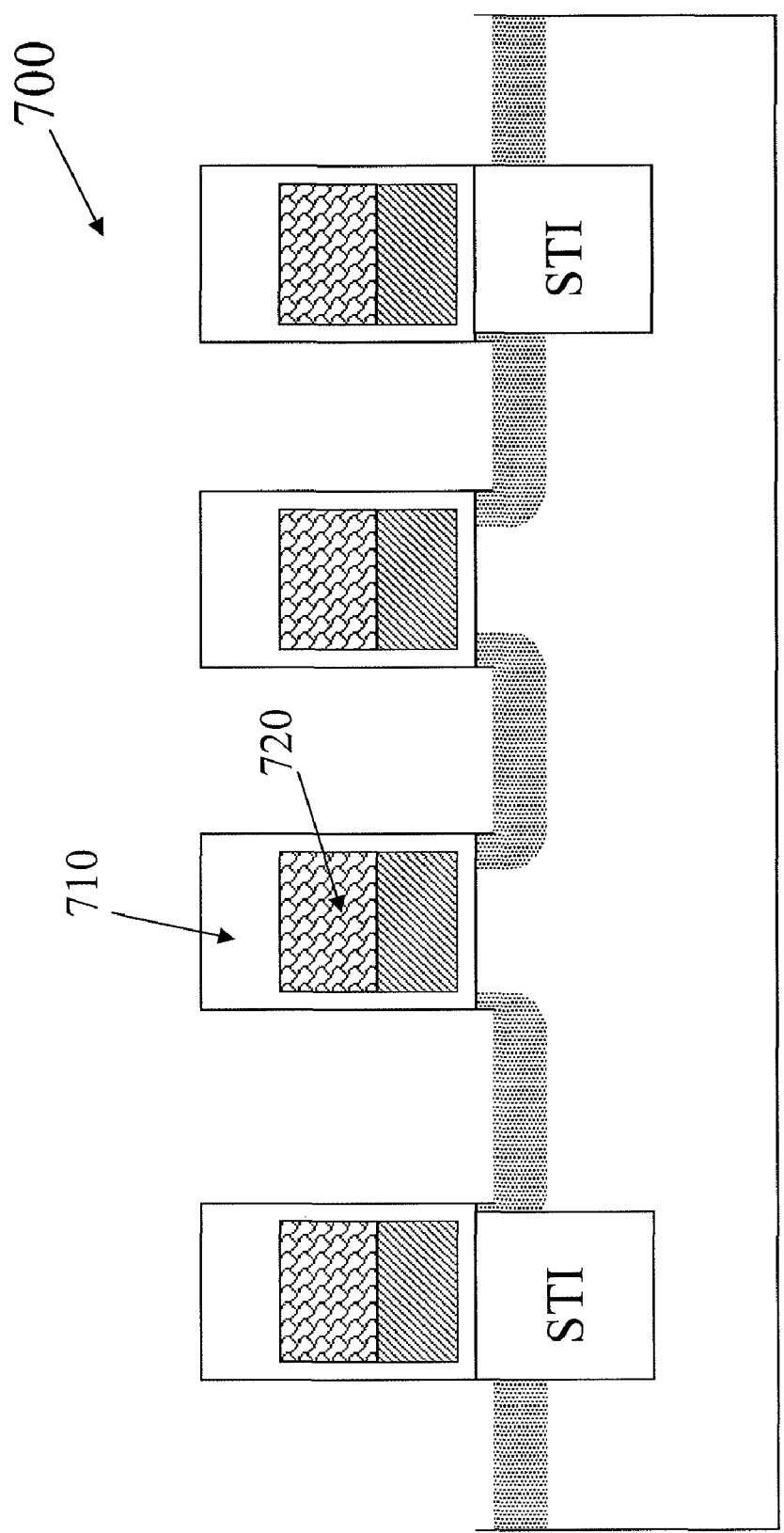
FIG. 7 – BPSG, nitride, Si recess etch

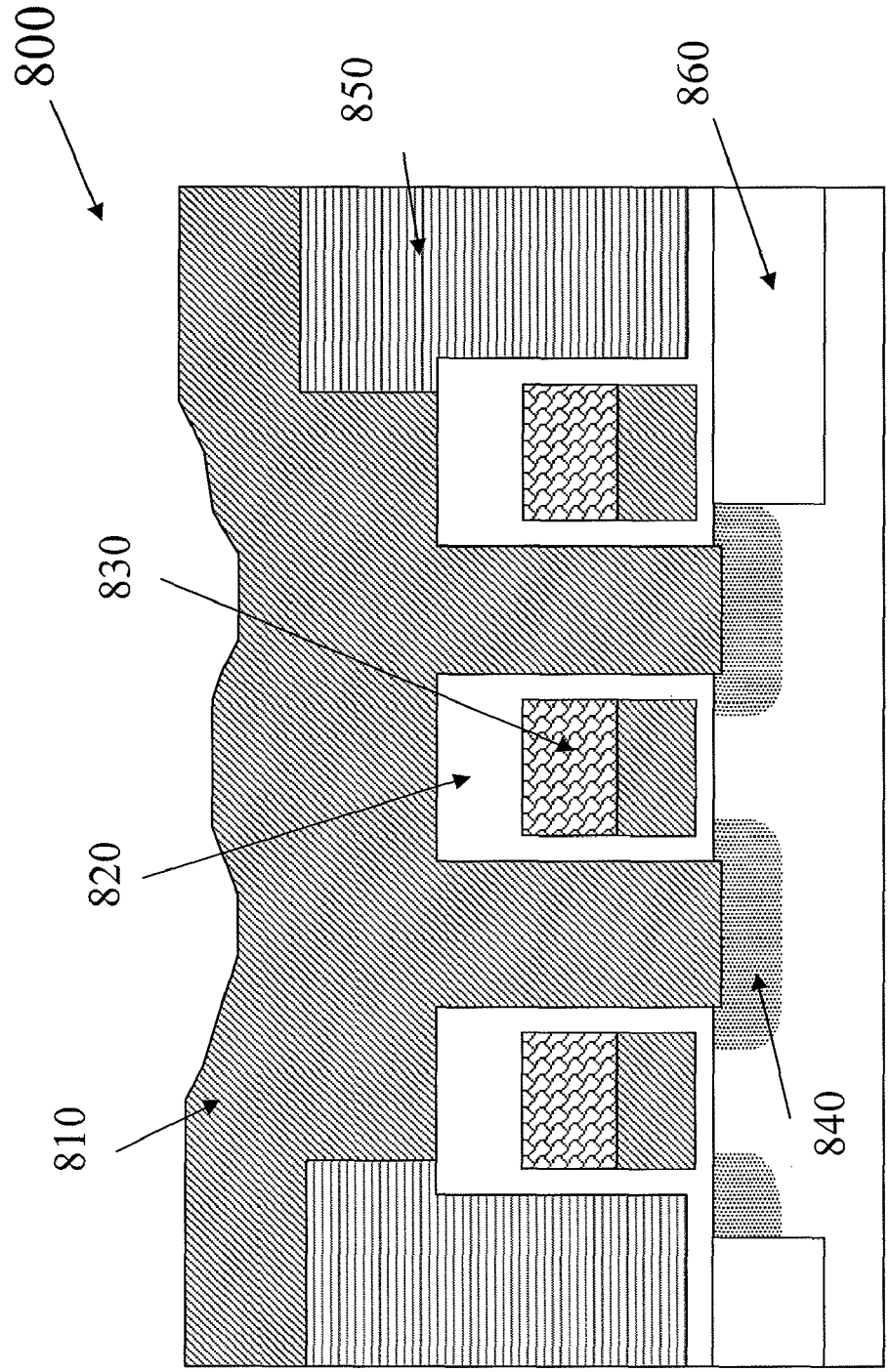
FIG. 8 – poly LPC dep

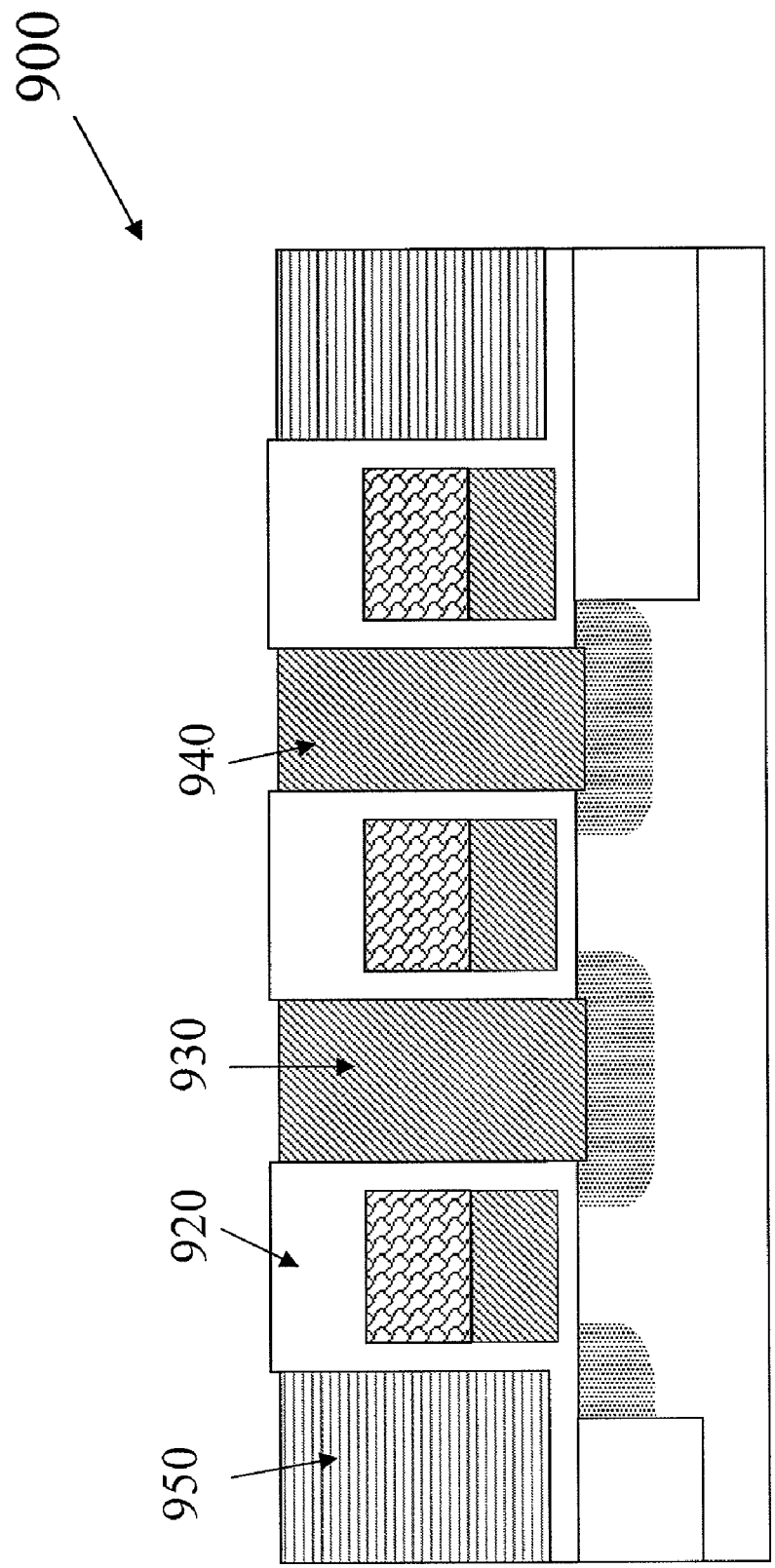
FIG. 9 - CMP

METHOD AND SYSTEM FOR CONTINUOUS LINE-TYPE LANDING POLYSILICON CONTACT (LPC) STRUCTURES

CROSS-REFERENCES TO RELATED APPLICATIONS

This application claims priority to Chinese Patent Application No. 200910056718.1, filed Aug. 20, 2009, entitled "A METHOD AND SYSTEM FOR CONTINUOUS LINE-TYPE LANDING POLYSILICON CONTACT (LPC) STRUCTURES," by inventors PING TING WANG et al., commonly assigned, incorporated by reference herein for all purposes.

BACKGROUND OF THE INVENTION

The present invention is directed to integrated circuits and their processing for the manufacture of semiconductor devices. More particularly, the invention provides a method and system for using a continuous line-type pattern to form landing polysilicon contacts in integrated circuit devices. Merely by way of example, the invention has been applied to dynamic random access memory devices. But it would be recognized that the invention has a much broader range of applicability. For example, the invention can be applied to a variety of other applications such as application specific integrated circuits, microprocessors, microcontrollers, other memory applications, and the like.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the formation of devices of increasingly small geometries used for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, as device geometry continues to shrink, it becomes increasing difficult to form small contact holes. FIGS. 1a-1c are view diagrams for a conventional contact hole patterning method. As shown, FIG. 1a is a top view of a contact hole layout diagram with lateral contact hole dimension about 130 nm and vertical dimension about 140 to 180 nm. FIG. 1b is a top view of photo resist patterns superimposed over contact hole layout patterns. It can be seem that the contact hole patterns formed in the photoresist are rounded structures with varying sizes. FIG. 1c is a 3-dimensional view diagram of contact hole patterns in the photoresist, showing the circular openings and varying sizes. These and other limitations are described throughout the present specification and more particularly below.

From the above, it is seen that an improved technique for processing semiconductor devices is desired.

BRIEF SUMMARY OF THE INVENTION

According to an embodiment of the present invention, techniques for manufacturing semiconductor devices are provided. More particularly, the invention provides a method and system for using a continuous line-type pattern to form landing polysilicon contacts in integrated circuit devices. Merely by way of example, the invention has been applied to dynamic random access memory devices. But it would be recognized that the invention has a much broader range of applicability. For example, the invention can be applied to a variety of other applications such as application specific integrated circuits, microprocessors, microcontrollers, other memory applications, and the like.

In a specific embodiment, the invention provides a method for making a semiconductor integrated circuit memory device. The method includes providing a semiconductor substrate and forming an isolation region in the semiconductor substrate. The methods includes forming a first and a second active regions in the semiconductor substrate. The active regions are separated by the isolation region. In an embodiment, the method forms a plurality of word lines, with one or more of the word lines overlying the first active region, one or more of the plurality of word lines overlying the second active region, and at least one of the plurality of word lines overlying the isolation region. The method includes depositing a silicon nitride cap layer and forming an interlayer dielectric layer overlying the nitride cap layer. The method also includes depositing a photoresist layer overlying the interlayer dielectric layer and using a mask pattern to selectively remove a portion of the photoresist layer to form a line type opening, which exposes a portion of the interlayer dielectric layer overlying at least the first and second active regions and the isolation region. The method further includes removing the interlayer dielectric material exposed in the line type opening of the photoresist, and selectively removing a portion of the nitride material to expose the semiconductor substrate between the word lines. The method removes a predetermined thickness of the exposed semiconductor substrate material and deposits polysilicon fill material overlying the exposed semiconductor regions, the nitride layer overlying the word lines, and the interlayer dielectric material. The method also includes performing a chemical mechanical planarization process on the polysilicon fill material and the interlayer dielectric material using the cap nitride layer overlying each of the word lines as a polish stop layer, whereby a plurality of polysilicon landing contact pads are formed and separated by the word lines.

In a specific embodiment, the memory device includes a DRAM device. In another embodiment, one or more of the plurality of word lines can be dummy line structures. In an embodiment, the forming of the interlayer dielectric layer further includes planarizing the interlayer dielectric layer. In some embodiments, the memory device further includes at least one bit line, and the line type opening is characterized by a length substantially equal to a length of the bit line. In a specific embodiment, the interlayer dielectric layer is BPSG. In certain embodiments, the polysilicon fill material is in-situ doped and deposited in an amorphous state. In an embodiment, the chemical mechanical planarization process including a slurry with a selectivity of about 1:1 for the interlayer dielectric and polysilicon. In a specific embodiment, the polysilicon fill material forms a plug structure having a width of 0.06 to 0.15 microns.

According to another embodiment of the present invention, a method is provided for making contact landing pad structures in a semiconductor integrated circuit device. The method includes providing a semiconductor substrate, forming an isolation region in the semiconductor substrate, and forming a first and a second active regions in the semiconductor substrate. The active regions are separated by the isolation region, each of the active regions including one or more contact regions. The method includes forming a raised structure of a predetermined height between a first and second contact regions. The raised structure overlies the isolation region. In an embodiment, the method deposits a cap layer and forms an interlayer dielectric layer overlying the cap layer. The method also includes depositing a photoresist layer overlying the interlayer dielectric layer. In an embodiment, the method uses a mask pattern to selectively remove a portion of the photoresist layer to form a line type opening which exposes a portion of the interlayer dielectric layer overlying at least the first and second contact regions. The method also includes removing the interlayer dielectric material exposed in the line type opening of the photoresist. The method further includes selectively removing a portion of the cap material to expose the semiconductor substrate in the contact regions. The method also includes removing a predetermined thickness of the exposed semiconductor substrate material, and depositing a conductive fill material overlying the exposed semiconductor regions, the cap layer overlying the raised structure, and the interlayer dielectric material. The method also includes performing a planarization process on the conductive fill material and the interlayer dielectric material, whereby a plurality of conductive landing contact pads are formed. In a specific embodiment, the raise structure is a word line of a memory device. In an embodiment, the conductive fill material includes a polysilicon material. In another embodiment, the conductive fill material includes tungsten. In certain embodiments, the cap layer includes a silicon nitride layer. In some embodiments, the interlayer dielectric material includes BPSG. In a specific embodiment, the semiconductor integrated circuit device is a memory device. In an embodiment, the semiconductor integrated circuit device is a DRAM device. In a specific embodiment, the memory device further comprises at least one bit line and the line type opening is characterized by a length substantially equal to a length of the bit line.

According to an alternative embodiment, the present invention provides a semiconductor memory device. The device includes a semiconductor substrate, an isolation region in the semiconductor substrate, and a first and a second active regions in the semiconductor substrate. The active regions are separated by the isolation region. The device includes a plurality of word lines, one or more of the plurality of word lines overlying the first active region, one or more of the plurality of word lines overlying the second active region, and at least one of the plurality of word lines overlying the isolation region. The device also includes a silicon nitride cap layer overlying the word lines. The nitride cap layer also covers the sides of the word lines. The device includes an interlayer dielectric layer overlying the semiconductor substrate. The device also includes a plurality of polysilicon landing contact pads, which are separated from one another by the dielectric layer and by one or more of the word lines. In a specific embodiment, the contact pads are formed using a mask pattern to selectively remove a portion of a photoresist layer to form a line type opening, which exposes a portion of the interlayer dielectric layer overlying at least the first and second active regions and the isolation region. In a specific embodiment, the semiconductor integrated circuit device is a DRAM device. In an embodiment, the memory device further includes at least one bit line and the line type opening is characterized by a length substantially equal to a length of the bit line. In some embodiments, the polysilicon pads are in-situ doped and deposited in an amorphous state.

Many benefits are achieved by way of the present invention over conventional techniques. For example, the present technique provides an easy to use process that relies upon conventional technology. In some embodiments, the invention provides a method for using a continuous line-type pattern to form landing polysilicon contacts in integrated circuit devices. Additionally, the method provides a process that is compatible with conventional process technology without substantial modifications to conventional equipment and processes. In some embodiments, the invention provides a method for improving lithography depth of focus and exposure latitude for forming contact structures. In certain specific embodiments, the invention provides a method for extending the utility of current lithography tools to next generation devices. In various embodiments, the invention provides a method for reducing the lithography cost of integrated circuit fabrication. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 7-9 are simplified cross sectional view diagrams of device structures illustrating a method for making an integrated circuit device according to an embodiment of the present invention;

DETAILED DESCRIPTION OF THE INVENTION

Figure 1A:
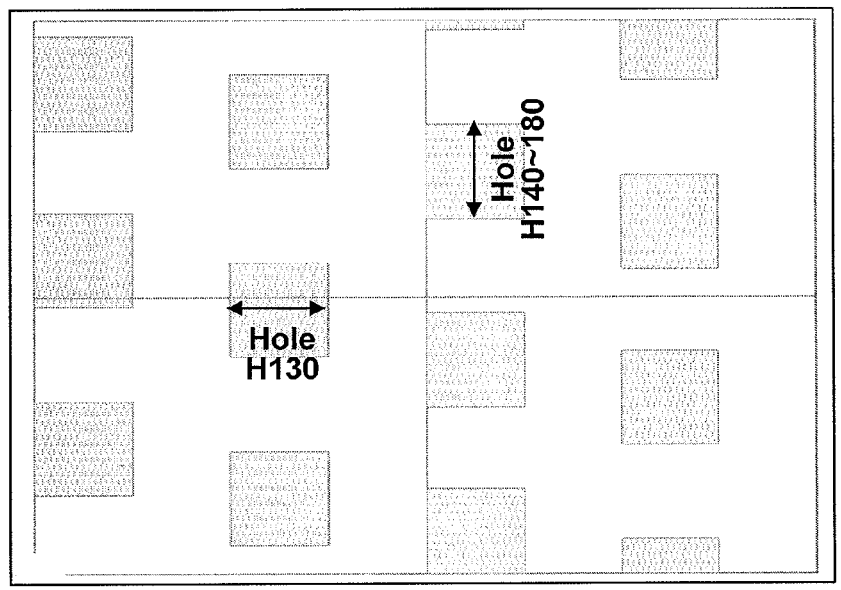
FIGS. 1a-1c are view diagrams for a conventional contact hole patterning method.
Figure 1B:
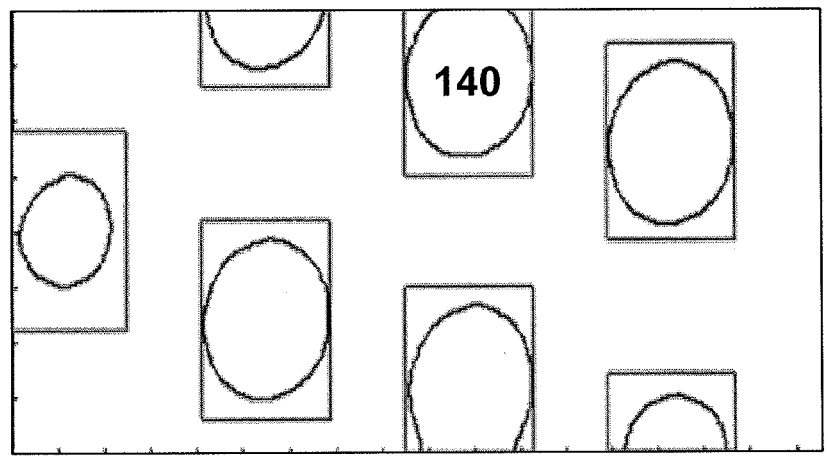
Figure 1C:
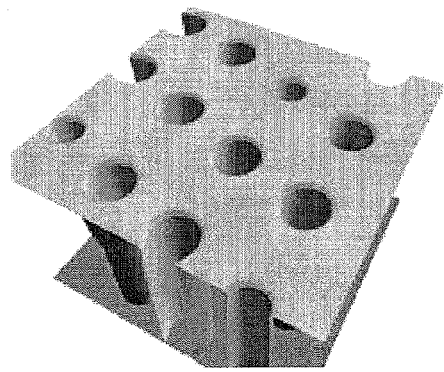

According to an embodiment of the present invention, techniques for manufacturing semiconductor devices are provided. More particularly, the invention provides a method and system for using a continuous line-type pattern to form landing polysilicon contacts integrated circuit devices. Merely by way of example, the invention has been applied to dynamic random access memory devices. But it would be recognized that the invention has a much broader range of applicability. For example, the invention can be applied to a variety of other applications such as application specific integrated circuits, microprocessors, microcontrollers, other memory applications, and the like.

As discussed previously, as device geometry continues to shrink, it becomes increasing difficult to form small contact holes. For complex integrated circuit devices, a method has been developed to form contact landing pads, upon which contact holes can be formed in an interlayer dielectric material. However, with the device geometry reduced to 0.11 um, lithography demand is stretching the limit of high-NA KrF scanners. An expensive alternative is to use a high resolution scanner, such as a 193 nm scanner, in combination with a high quality photoresist. Another alternative is to develop a new process using the 248 nm KrF scanner which is less expensive. For example, the depth-of-focus (DOF) margin provided by a 248 nm laser often is not enough for consistent definition of landing contact holes structures with the hole critical dimension (CD) about 130 nm. Often it is necessary to use resolution enhancement methods. For example chemical technologies as RELACS, SAFIER and Thermal Flow Process have been implemented. However, the lithography process window is still limited. In 0.11 um DRAM application, there are numerous contacts holes having small process windows. Such processes tend to have a low manufacturing yield. Therefore there is a need for an improved technique for forming contact structures in advanced memory devices.

A method for forming a continuous line-type landing polysilicon contact (LPC) structures according to an embodiment of the present invention can be briefly outlined below.

1. (step 210) Provide substrate including device structures.
2. (step 220) Deposit nitride cap layer;
3. (step 230) Deposit insulator layer;
4. (step 240) Form continuous line-type pattern in photoresist;
5. (step 250) Etch to form line-type patterns;
6. (step 260) Deposit polysilicon;
7. (step 270) Planarize poly and BPSG, stop on nitride; and
8. (step 280) Perform backend process.

The above sequence of steps provides a method for forming landing polysilicon contact (LPC) structures according to an embodiment of the present invention. As shown, the method uses a combination of steps including a way of forming a continuous line-type pattern in the photoresist for forming landing polysilicon contact pad structures. Other alternatives can also be provided where steps are added, one or more steps are removed, or one or more steps are provided in a different sequence without departing from the scope of the claims herein. Further details of the present method can be found throughout the present specification and more particularly below with reference to FIG. 2.

Figure 2:
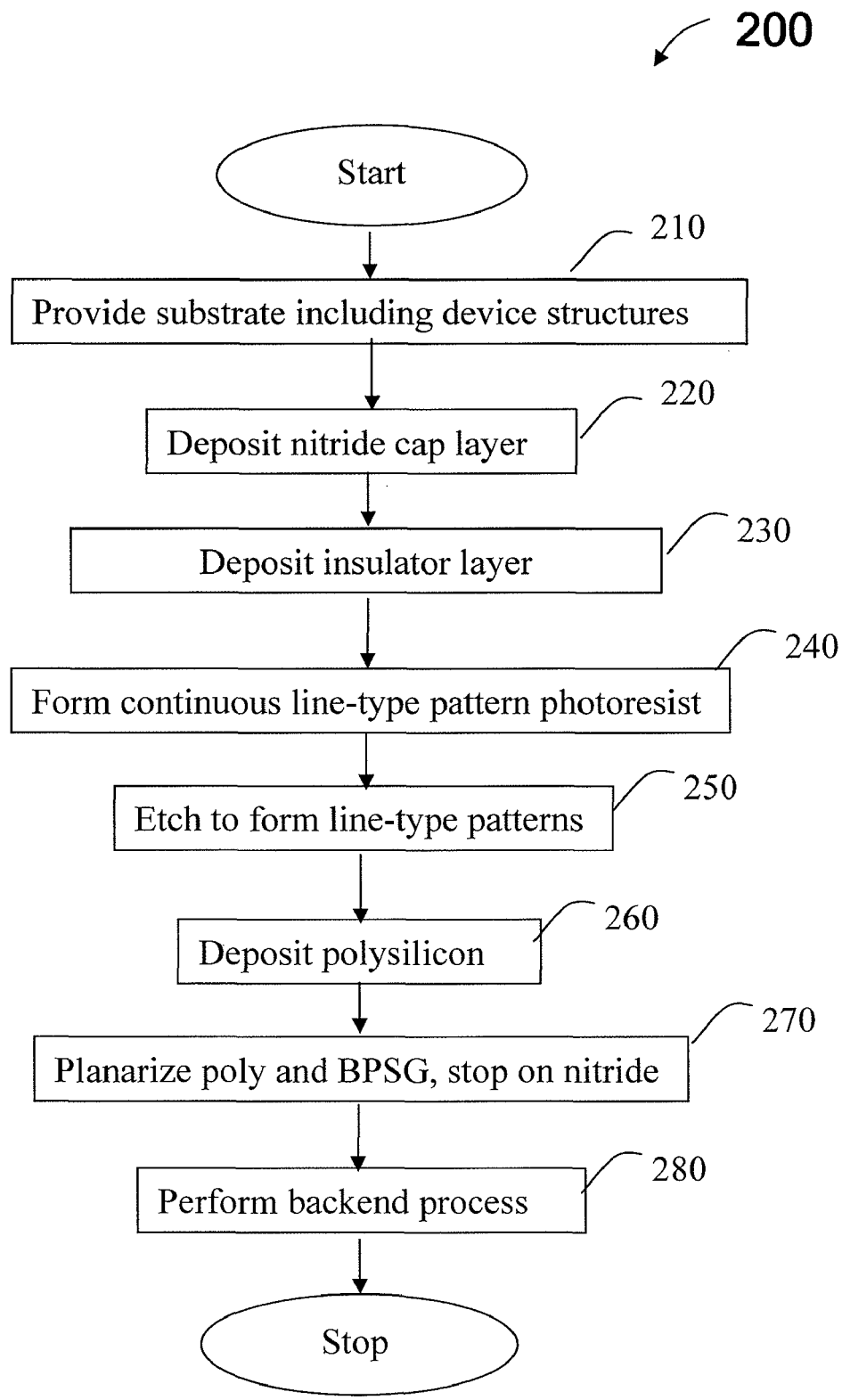
FIG. 2 is a simplified flow diagram for a method for making an integrated circuit device according to an embodiment of the present invention.

FIG. 2 is a simplified flow diagram for a method 200 for making an integrated circuit device according to an embodiment of the present invention. This diagram is merely an example, which should not unduly limit the scope of the claims herein. One of ordinary skill in the art would recognize other variations, modifications, and alternatives. As shown, the method uses a continuous line-type photoresist pattern to form poly landing contact structures. The method includes providing a substrate including device structures (step 210). In a preferred embodiment, the device structures include active areas and isolation areas. In a specific embodiment, the devices structures are DRAM devices which can include transistors built in active areas, capacitors for storing charge, isolation structures such as shallow trench isolation regions, and the like. Of course, there are other variations, modifications, and alternatives.

Figure 3:
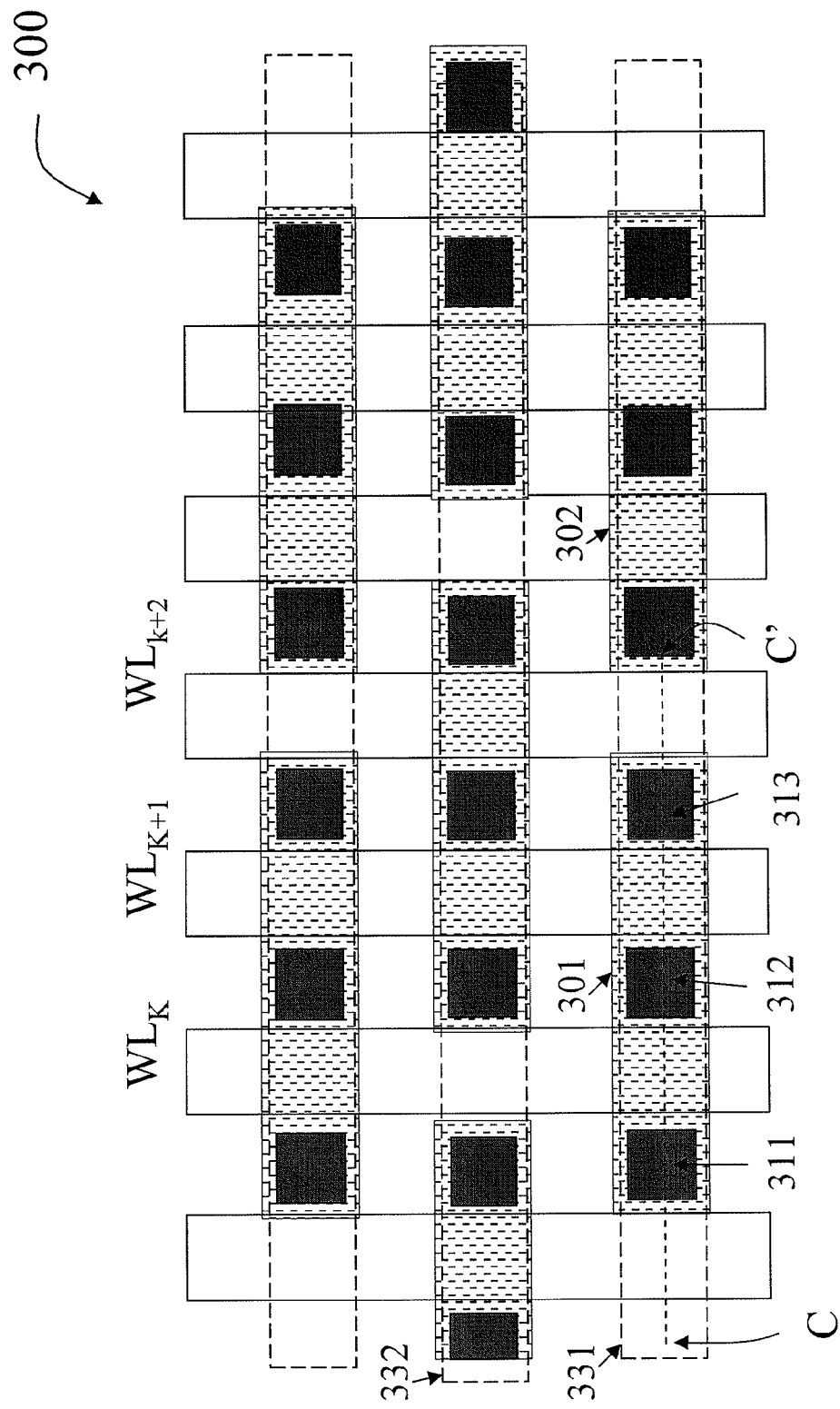
FIG. 3 is a simplified top view layout diagram for a method for making an integrated circuit device according to an embodiment of the present invention.

Merely as an example of device structures provided by the method, FIG. 3 is a simplified top view layout diagram 300 of a method for forming an integrated circuit according to an embodiment of the present invention. This diagram is merely an example, which should not unduly limit the scope of the claims herein. One of ordinary skill in the art would recognize other variations, modifications, and alternatives. As shown, device layout diagram 300 includes active areas (AA) such as 301 and 302, etc. FIG. 3 also includes numerous word lines, such as $WL_K$, $WL_{K+1}$, $WL_{K+2}$, etc., and contact regions such as 311, 312, and 313, etc. Layout diagram 300 also includes line-type polysilicon contact patterns 331 and 332, which will be discussed in more detail below.

Figure 4:
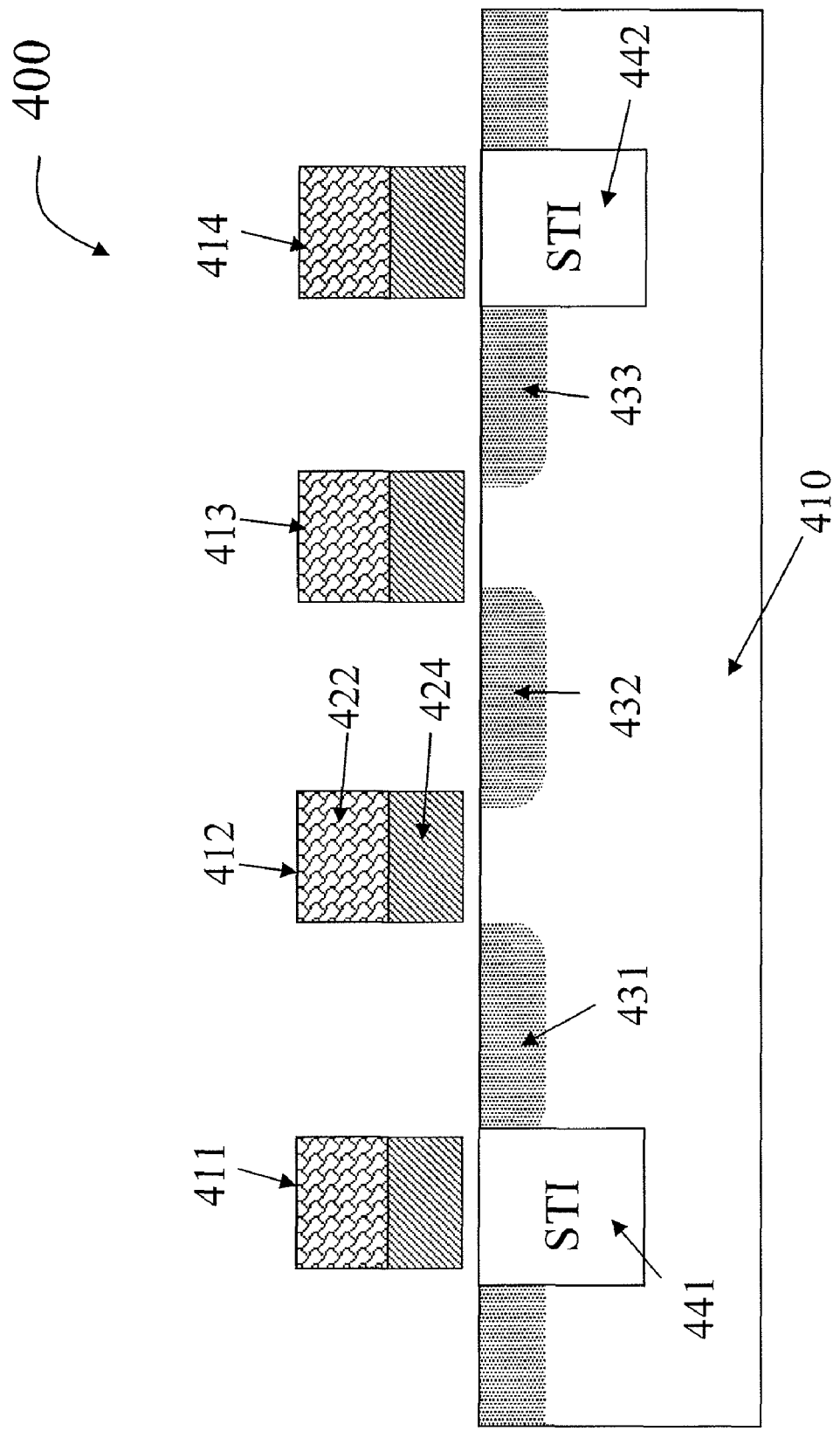
FIG. 4 is a simplified cross sectional view diagram of device structure 400 illustrating a method for making an integrated circuit device according to an embodiment of the present invention.

FIG. 4 is a cross sectional view diagram of a device structure 400 along dotted line CC' in FIG. 3. This diagram is merely an example, which should not unduly limit the scope of the claims herein. As shown, device structure 400 includes substrate 410 and diffusion areas 431, 432, and 433, etc., which may be source/drain regions of a transistor and may be used as contact regions. Device structure 400 also includes isolation regions 441 and 442. In a specific embodiment, isolation region can be shallow trench isolation (STI) regions. Device structure 400 also includes word lines, such as 411, 412, 413, and 414. In a specific embodiment, each word line, for example 412, includes a silicide region 422 overlying a polysilicon gate region 424. In the example shown in 400, word line 411 overlies isolation region 441, and word line 414 overlies isolation region 442. This diagram is merely an example, which should not unduly limit the scope of the claims herein. One of ordinary skill in the art would recognize other variations, modifications, and alternatives.

Figure 5:
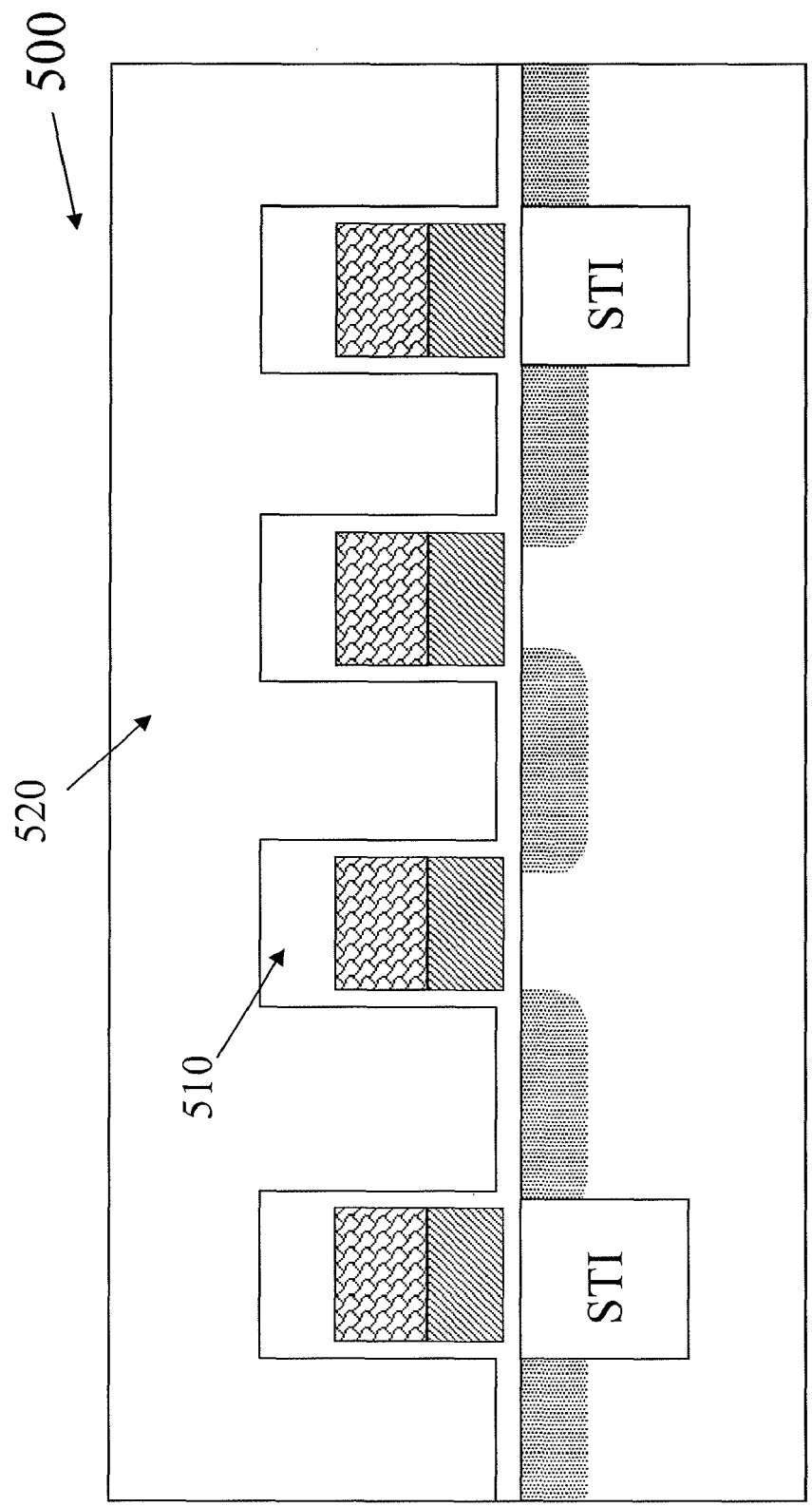
FIG. 5 is a simplified cross sectional view diagram of device structure 500 illustrating a method for making an integrated circuit device according to an embodiment of the present invention.

FIG. 5 is a simplified cross sectional view diagram of a device structure 500 illustrating the method 200 for making an integrated circuit device according to an embodiment of the present invention. This diagram is merely an example, which should not unduly limit the scope of the claims herein.

One of ordinary skill in the art would recognize other variations, modifications, and alternatives. Referring to FIGS. 2 and 5, the method includes depositing nitride cap layer 510 over the device structure (step 220). The method also includes forming an insulator layer 520 over the nitride layer (step 230). In an embodiment, insulator layer 520 is an interlayer dielectric including a doped glass layer, such as a BPSG, FSG, and others.

Preferably, the method includes depositing a photoresist resist layer and patterning the photoresist layer for forming polysilicon contact landing structures, step 240. An example of the continuous line-type polysilicon contact pattern is shown previously in the simplified layout diagram 300 in FIG. 3. Continuous line-type polysilicon contact structure patterns, such as 331 and 332 in FIG. 3, are formed in a photoresist layer. As shown in FIG. 3, the LPC patterns are formed along a direction to include numerous contact regions over two or more active regions, for example, 301 and 302, etc. In a specific embodiment, the LPC patterns are formed perpendicular to a word line direction and along a bit line (not shown) direction. In certain embodiment, the LPC patterns can include all the contact regions in active regions along a length of a bit line of a DRAM memory array. In some embodiments, a bit line can be associated with thousands of active regions, and each active region can include two or more contact regions. Of course, there are other variations, modifications, and alternatives.

Figure 6A:
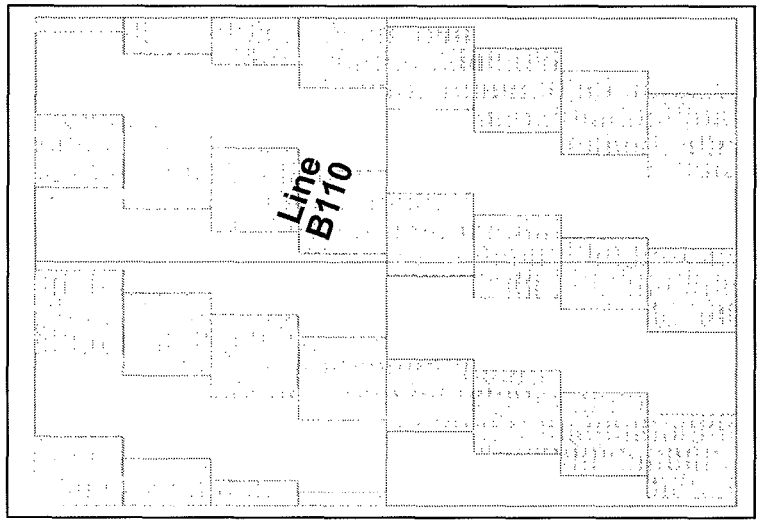
FIGS. 6a-6c are simplified view diagrams of a method for forming a continuous line-type landing polysilicon contact (LPC) pattern for an integrated circuit device according to an embodiment of the present invention.
Figure 6B:
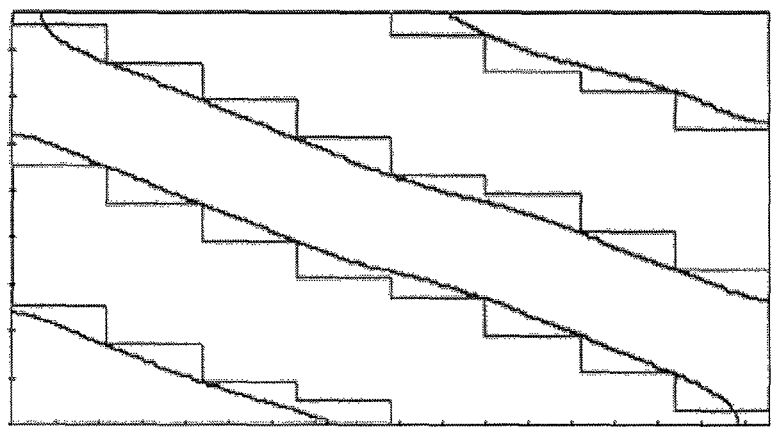
Figure 6C:
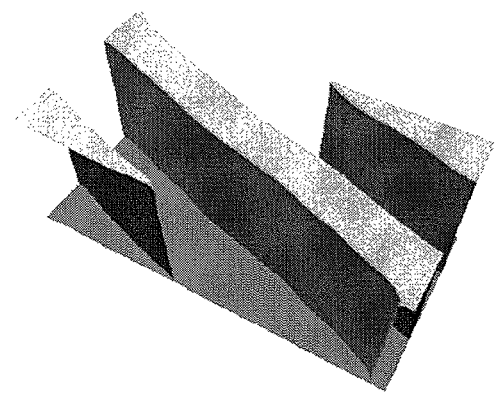

In a preferred embodiment, an LPC pattern is formed along a line to include numerous contact regions. FIGS. 6a-6c are simplified view diagrams for a method of forming a continuous line-type landing polysilicon contact (LPC) pattern for an integrated circuit device according to an embodiment of the present invention. These diagrams are merely examples, which should not unduly limit the scope of the claims herein. One of ordinary skill in the art would recognize other variations, modifications, and alternatives. As shown, FIG. 6a is a top view of a line-type polysilicon contact (LPC) pattern layout diagram with lateral dimension about 110 nm. FIG. 6b is a top view of photo resist patterns superimposed over the LPC layout patterns. It can be seem that the LPC patterns formed in the photoresist are line-type structures having a consistent width. FIG. 6c is a 3 dimensional view diagram of LPC patterns in the photoresist, showing line-type openings in the photoresist.

In step 250, the method includes etching steps to form LPC structures using the patterned photoresist as a mask. FIG. 7 is a simplified view diagram for device structure 700 illustrating the method 200 for making an integrated circuit device according to an embodiment of the present invention. This diagram is merely an example, which should not unduly limit the scope of the claims herein. One of ordinary skill in the art would recognize other variations, modifications, and alternatives. As shown in FIG. 7, the method includes removing the interlayer material such as BPSG. The method includes using a dry etching process which provides etch selectivity between BPSG and nitride. In an embodiment, the method removes relatively little nitride while removing all the exposed BPSG. The method includes removing the remaining nitride material exposed in the openings of the patterned resist. The method also includes additional silicon recess etch to expose a silicon surface for contact pad formation. An example of the device structure after the removal of silicon nitride and recess silicon layer between word lines is shown in FIG. 7. As shown, nitride cap regions such as 710 remain on the top and sides of word lines such as 720. These diagrams are merely examples, which should not unduly limit the scope of the claims herein. One of ordinary skill in the art would recognize other variations, modifications, and alternatives.

In step 260, the method deposits a polysilicon layer after the photo resist layer has been removed following the etch processes. FIG. 8 is a simplified cross sectional view diagram of device structure 800 that includes various device structures merely for illustrating certain features of a method for forming LPC structures according to an embodiment of the present invention. This diagram is merely an example, which should not unduly limit the scope of the claims herein. One of ordinary skill in the art would recognize other variations, modifications, and alternatives. As shown, the method deposits polysilicon layer 810 to overlie the exposed device structures. For example, such device structures may include a nitride layer 820 overlying word lines or transistor gates 830, diffusion regions 840, insulator region 850, and isolation regions 860. Preferably, the polysilicon fill material is doped polysilicon material, such as in-situ doped polysilicon material. The material can be deposited in an amorphous or polysilicon state, depending upon the application. If deposited in the amorphous state, it is later crystallized into the polysilicon state. The dopant can be phosphorous having a concentration ranging from about $1.4E^{20}$ cm$^{-3}$ to about $1.4E^{21}$ cm$^{-3}$, depending upon the application. Of course, there can be other variations, modifications, and alternatives.

Next, the method performs a planarization process (step 270). In a preferred embodiment, the method performs a chemical mechanical planarization process on the polysilicon material. The method continues the chemical mechanical planarization process to remove the interlayer dielectric material and the polysilicon film material until the cap nitride layer on each of the word line device structures has been exposed. Preferably, the polysilicon fill material and the interlayer dielectric material are simultaneously removed. The method uses the cap nitride layer overlying each of the device structures as a polish stop layer. Of course, there can be other variations, modifications, and alternatives.

FIG. 9 is a simplified cross sectional view diagram of device structure 900 illustrating a method for making an integrated circuit device including LPC structures according to an embodiment of the present invention. This diagram is merely an example, which should not unduly limit the scope of the claims herein. As shown, after the CMP process, nitride cap layer 920 and insulator layer 950 have been planarized. Landing polysilicon contact structures 930 and 940 have been formed. In a specific embodiment, self-aligned LPCs 930 and 940 are separated by nitride capped word lines. In an alternative embodiments, the landing polysilicon contact structures can be separated by nitride capped dummy patterns. Of course, one of ordinary skill in the art would recognize other variations, modifications, and alternatives.

In a specific embodiment, the present invention provides a method of simultaneously polishing polysilicon, BPSG, and silicon nitride using oxide slurry and stopping at a gate silicon nitride. The method includes an over-polishing time to remove some landing polysilicon contact pattern on the silicon nitride to touch polish the silicon nitride. Preferably, a little silicon nitride film is removed at the pattern to obtain an adequate gate silicon nitride critical dimension, reduce dishing, and reduce erosion of polysilicon and BPSG.

Landing polysilicon contact is often a critical process for 0.13 um DRAM and next generation DRAM, but it needs to keep good top gate AEI critical dimension uniformity, lower dishing and erosion at landed polysilicon contact poly CMP step, which is difficult using a conventional polysilicon slurry. The present invention has a method that uses an oxide slurry to polish polysilicon, BPSG and silicon nitride at the same time to form polysilicon contact structures, thereby achieve high throughput.

Figure 10:
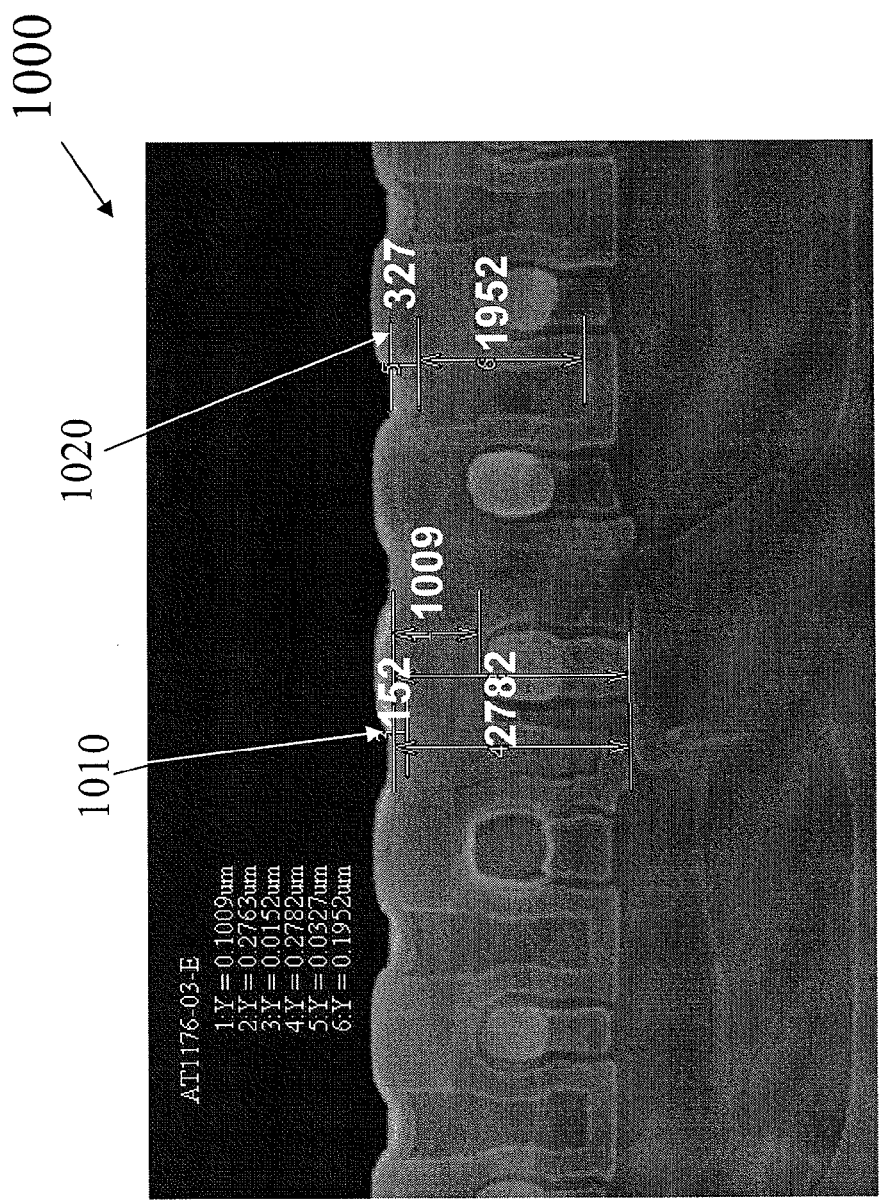
FIG. 10 is a simplified cross sectional SEM diagram of a method for making an integrated circuit device according to an embodiment of the present invention.

FIG. 10 is a simplified cross sectional SEM image 1000 of an integrated circuit device including LPC structures according to an embodiment of the present invention. This diagram is merely an example, which should not unduly limit the scope of the claims herein. One of ordinary skill in the art would recognize other variations, modifications, and alternatives. As shown, polysilicon region 1010 exhibits a dishing of only about 150 angstroms, and BPSG region 1020 includes dishing of about 300 angstroms.

Figure 11:
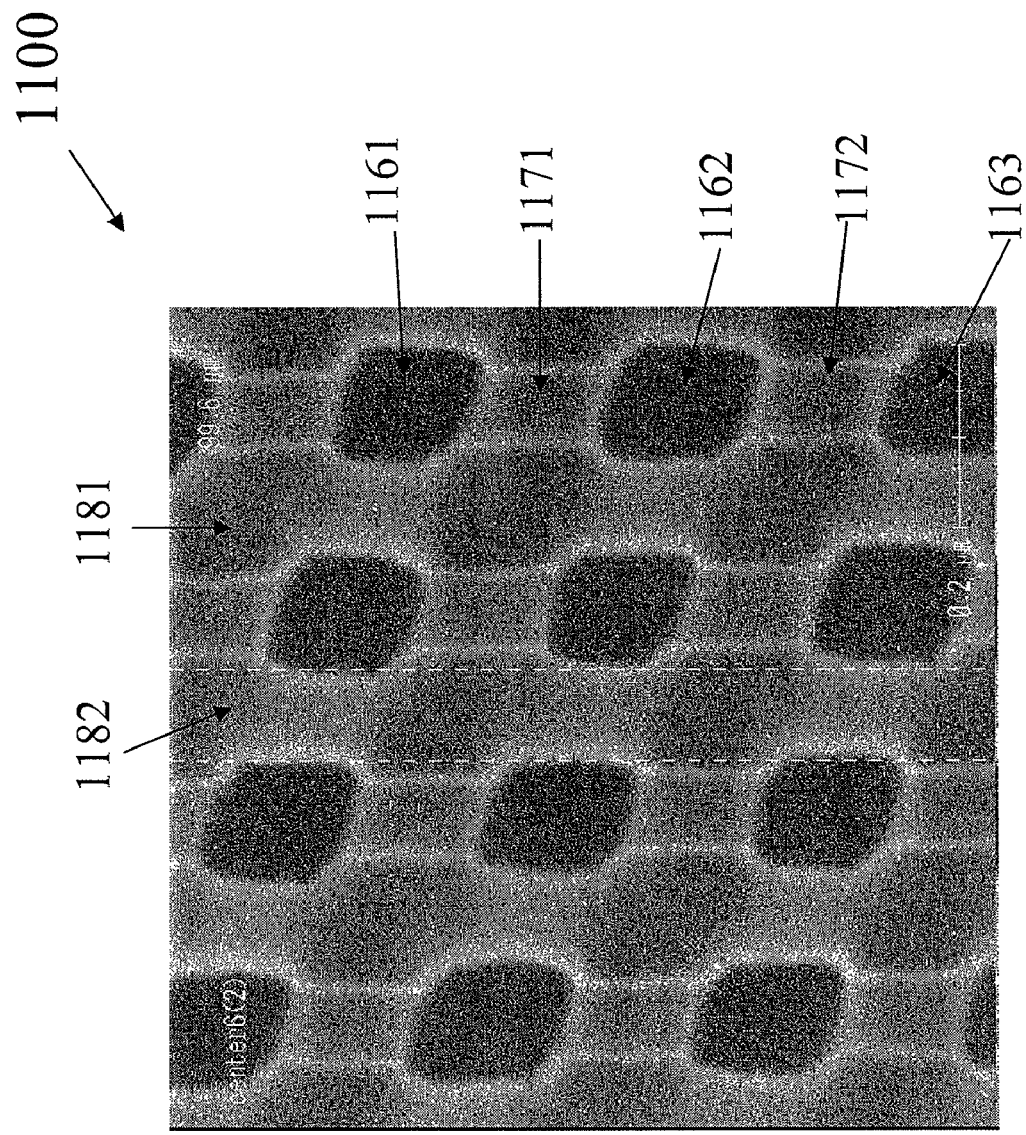
FIG. 11 is a simplified top view SEM diagram of a method for making an integrated circuit device according to an embodiment of the present invention.

FIG. 11 is a simplified top view SEM image 1100 of an integrated circuit device including LPC structures according to an embodiment of the present invention. This diagram is merely an example, which should not unduly limit the scope of the claims herein. One of ordinary skill in the art would recognize other variations, modifications, and alternatives. As shown, polysilicon regions 1161, 1162, and 1163 are separated by nitride regions 1171 and 1172, respectively. A BPSG region, such as 1181 or 1182, separates two columns of LPC structures, as shown in the example of FIG. 11.

Optionally, the method performs an etching process to remove certain polysilicon material from an line-type polysilicon contact structure. In certain embodiments, it may be desirable to remove polysilicon material to form separation regions in a continuous line-type polysilicon contact structure which may include numerous contact regions. This removal may be accomplished using a masked reactive ion etch (RIE) process. Of course, one of ordinary skill in the art would recognize other variations, modifications, and alternatives.

In step 280, the method performs backend processes. Depending upon the embodiments, the method can include forming a dielectric layer, forming contact holes to be aligned with LPC structures, filling the contact holes, depositing a metal layer, and patterning the metal layer to form interconnect lines. In an embodiment, the method can include forming multilevel interconnect structures. Of course, there can be other variations, modifications, and alternatives.

The above sequence of steps provides a method for forming polysilicon contact landing pad structures using continuous line-type polysilicon contact (LPC) patterns according to an embodiment of the present invention. As shown, the method uses a combination of steps including a way of forming a continuous line-type openings in photoresist layer and a self-aligned planarization process to separate the LPC structures for individual contacts. Other alternatives can also be provided where steps are added, one or more steps are removed, or one or more steps are provided in a different sequence without departing from the scope of the claims herein. Additionally, although the above has been described in terms of a DRAM device, other devices can also be used. Further details of these other devices using the present method can be found throughout the present specification and more particularly below.

Figure 12A:
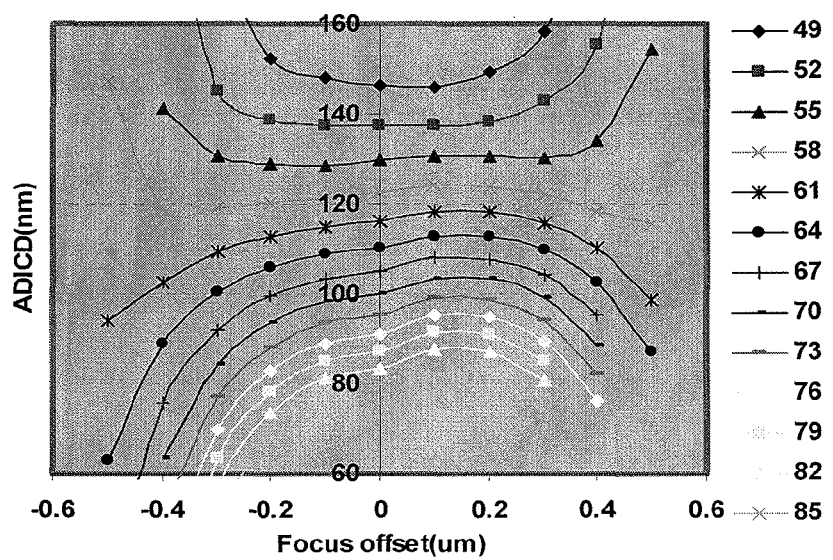
FIG. 12a is a simplified depth-of-focus (DOF) diagram of a method for forming a photoresist patterns according to an embodiment of the present invention.
Figure 12B:
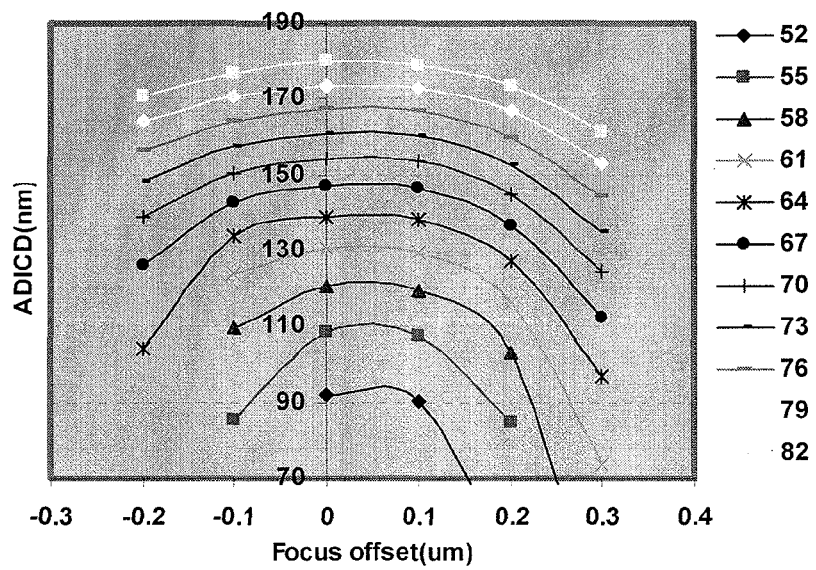
FIG. 12b is a simplified depth-of-focus (DOF) diagram of a conventional method for forming a photoresist patterns.

According to an embodiment of the inventions, forming polysilicon contact landing pad structures using a continuous line-type polysilicon contact (LPC) patterns provides many advantages over conventional hole type contact structures. Merely as an example, FIG. 12a is a simplified depth-of-focus (DOF) diagram for method of forming LPC photoresist patterns according to an embodiment of the present invention. In contrast, FIG. 12b is a simplified depth-of-focus (DOF) diagram for conventional method of forming a contact hole photoresist pattern. These diagrams are merely examples, which should not unduly limit the scope of the claims herein. One of ordinary skill in the art would recognize other variations, modifications, and alternatives. As shown, in FIG. 12a, a method according to an embodiment of the present invention provides a depth of focus (DOF) range of about 0.4 um (from about −0.1 um to about 0.3 um) for a critical LPC dimension (ADICD) of about 80 nm. In FIG. 12b, it can be seen than a conventional contact hole forming method can provide a depth of focus (DOF) range of only about 0.1 um (from about 0.0 um to about 0.1 um) for a critical LPC dimension (ADICD) of about 90 nm. Therefore, the LPC method according to certain embodiments of the invention provides improved critical dimension formation over a wider depth of focus range.

Figure 13A:
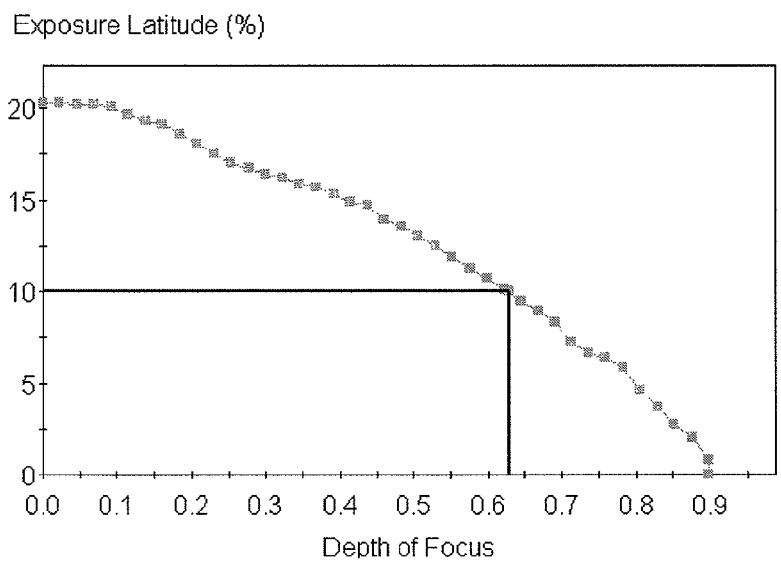
FIG. 13a is a simplified exposure latitude diagram of a method for forming a photoresist patterns according to an embodiment of the present invention.
Figure 13B:
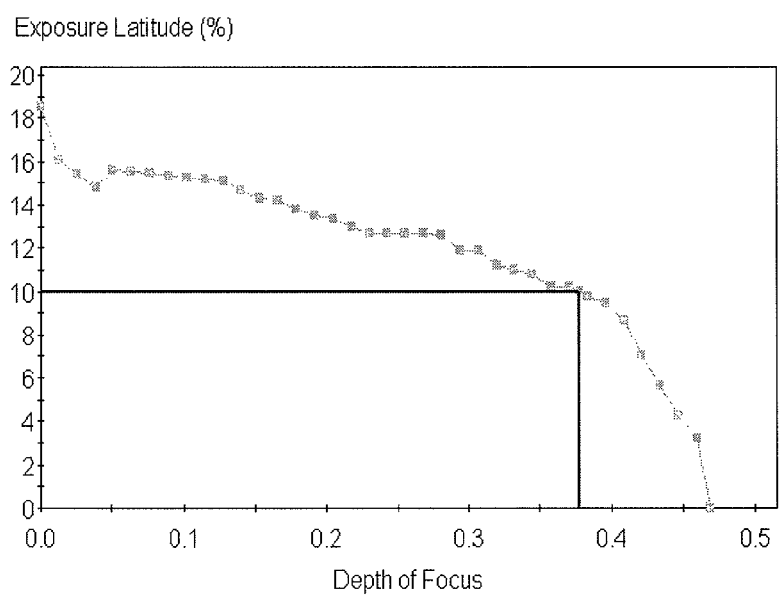
FIG. 13b is a simplified exposure latitude diagram of a conventional method for forming a photoresist patterns.

As another example, FIG. 13a is a simplified exposure latitude diagram of a method for forming LPC photoresist patterns according to an embodiment of the present invention. FIG. 13b is a simplified exposure latitude diagram of a conventional method for forming a contact hole photoresist pattern. As shown, an exposure latitude (EL) of 10% can be maintained over a depth of focus range of about 0.6 um according to an embodiment of the invention. In contrast, the conventional contact hole forming method can only provide an exposure latitude (EL) of 10% over a depth of focus range of about 0.38 um. Therefore, the LPC method according to embodiments of the invention provides an improved depth of focus range for a given exposure latitude requirement. Of course, these diagrams are merely examples, which should not unduly limit the scope of the claims herein. One of ordinary skill in the art would recognize other variations, modifications, and alternatives.

A simulation study has been carried out to compare an LPC method according to an embodiment of the present invention and a conventional contact hole formation. The result is listed below in Table I.

TABLE I

| Layout | Illum. | Best Conditions | SPEC | DOF (0% E/L) | DOF (10% E/L) | E/L (0um) |
|---|---|---|---|---|---|---|
| Hole type | A855580 | 67/0.0 | 140 +/− 14 nm | 0.47 um | 0.38 um | 18.5% |
| Line type | A855580 | 62/0.0 | 110 +/− 11 nm | 0.90 um | 0.63 um | 20.3% |

As shown, DOF margin and exposure latitude E/L are superior for an LPC method according to an embodiment of the present invention (Line type) over a conventional method for contact hole formation (hole type). Of course, these data are merely examples, which should not unduly limit the scope of the claims herein. One of ordinary skill in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making a semiconductor integrated circuit memory device, the method comprising:

providing a semiconductor substrate;

forming an isolation region in the semiconductor substrate;

forming a first and a second active regions in the semiconductor substrate, the active regions being separated by the isolation region;

forming a plurality of word lines, one or more of the plurality of word lines overlying the first active region, one or more of the plurality of word lines overlying the second active region, at least one of the plurality of word lines overlying the isolation region;

depositing a silicon nitride cap layer;

forming an interlayer dielectric layer overlying the nitride cap layer;

depositing a photoresist layer overlying the interlayer dielectric layer;

using a mask pattern to selectively remove a portion of the photoresist layer to form a line type opening, the line type opening exposing a portion of the interlayer dielectric layer overlying at least the first and second active regions and the isolation region;

removing a thickness of the interlayer dielectric layer that is exposed in the line type opening of the photoresist;

selectively removing a first portion of the silicon nitride cap layer to expose a semiconductor substrate region between the word lines while maintaining a second portion of the silicon nitride cap layer overlying the plurality of word lines;

removing a predetermined thickness of the exposed semiconductor substrate;

depositing a polysilicon fill material overlying the exposed semiconductor region, the nitride layer overlying the word lines, and the interlayer dielectric layer; and forming a plurality of polysilicon landing contact pads by performing a chemical mechanical planarization process on the polysilicon fill material and the interlayer dielectric layer using the second portion of silicon nitride cap layer as a polish stop layer.

2. The method as recited in claim 1, wherein the memory device includes a DRAM device.

3. The method as recited in claim 1, wherein one or more of the plurality of word lines are dummy line structures.

4. The method as recited in claim 1, wherein the forming of the interlayer dielectric layer further comprises planarizing the interlayer dielectric layer.

5. The method as recited in claim 1, wherein the memory device further comprises at least one bit line and the line type opening is characterized by a length substantially equal to a length of the bit line.

6. The method of claim 1, wherein the interlayer dielectric layer is BPSG.

7. The method of claim 1, wherein the polysilicon fill material is in-situ doped and deposited in an amorphous state.

8. The method of claim 1, wherein the chemical mechanical planarization process comprises a slurry having a selectivity of about 1:1 for the interlayer dielectric layer and the polysilicon fill material.

9. The method of claim 1, wherein the polysilicon fill material forms a plug structure, the plug structure having a width of 0.06 to 0.15 microns.

10. A method for making contact landing pad structures in a semiconductor integrated circuit device, the method comprising:

providing a semiconductor substrate;

forming an isolation region in the semiconductor substrate;

forming a first and a second active regions in the semiconductor substrate, the active regions being separated by the isolation region, each of the active regions including one or more contact regions;

forming a raised structure of a predetermined height between a first and second contact regions, the raised structure overlying the isolation region and having side portions;

depositing a cap layer;

forming an interlayer dielectric layer overlying the cap layer;

depositing a photoresist layer overlying the interlayer dielectric layer;

using a mask pattern to selectively remove a portion of the photoresist layer to form a line type opening, the line type opening exposing a portion of the interlayer dielectric layer overlying at least the first and second contact regions;

removing a thickness of the interlayer dielectric layer being exposed in the line type opening of the photoresist;

selectively removing a first portion of the cap layer to expose a semiconductor substrate region in the contact regions while maintaining a second portion of the cap layer entirely covering the raised structure including the side portions;

removing a predetermined thickness of the exposed semiconductor substrate region;

depositing a conductive fill material overlying the exposed semiconductor region, the second portion of the cap layer, and the interlayer dielectric layer; and forming a plurality of conductive landing contact pads by performing a planarization process on the conductive fill material and the interlayer dielectric.

11. The method as recited in claim 10, wherein the raised structure is a word line of a memory device.

12. The method as recited in claim 10, wherein the conductive fill material includes a polysilicon material.

13. The method as recited in claim 10, wherein the conductive fill material includes tungsten.

14. The method as recited in claim 10, wherein the cap layer includes a silicon nitride layer.

15. The method as recited in claim 10, wherein the interlayer dielectric layer includes BPSG.

16. The method as recited in claim 10, wherein the semiconductor integrated circuit device is a memory device.

17. The method as recited in claim 16, wherein the semiconductor integrated circuit device is a DRAM device.

18. The method as recited in claim 16, wherein the memory device further comprises at least one bit line and the line type opening is characterized by a length substantially equal to a length of the bit line.

19. The method as recited in claim 10, wherein forming the interlayer dielectric layer comprises planarizing the interlayer dielectric layer.

20. The method as recited in claim 10, wherein the planarization process comprises a chemical mechanical planarization including a slurry having a selectivity of about 1:1 for the interlayer dielectric layer and the polysilicon fill material.

* * * * *